US006927595B2

(12) United States Patent
Fleury et al.

(10) Patent No.: US 6,927,595 B2
(45) Date of Patent: Aug. 9, 2005

(54) DYNAMICALLY SWITCHED VOLTAGE SCREEN

(75) Inventors: Roger W. Fleury, Jericho, VT (US); Jon A. Patrick, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,261

(22) Filed: Nov. 1, 2004

(65) Prior Publication Data

US 2005/0083076 A1 Apr. 21, 2005

Related U.S. Application Data

(62) Division of application No. 10/285,960, filed on Nov. 1, 2002, now Pat. No. 6,822,471, which is a division of application No. 09/738,553, filed on Dec. 15, 2000, now Pat. No. 6,512,392, which is a division of application No. 09/062,043, filed on Apr. 17, 1998, now abandoned.

(51) Int. Cl.[7] .............................................. G01R 1/06
(52) U.S. Cl. .................................................... 324/765
(58) Field of Search ................................ 324/754–765, 324/158.1, 73.1; 438/14–18; 257/40, 48; 714/724, 730–73

(56) References Cited

U.S. PATENT DOCUMENTS

| 4,335,457 A | | 6/1982 | Early |
| 4,351,108 A | * | 9/1982 | Johnson ...................... 29/741 |
| 4,871,963 A | | 10/1989 | Cozzi |
| 4,902,969 A | * | 2/1990 | Gussman .................... 324/760 |
| 5,093,982 A | * | 3/1992 | Gussman ..................... 29/705 |
| 5,099,196 A | | 3/1992 | Longwell et al. |
| 5,196,787 A | | 3/1993 | Ovens et al. |
| 5,286,656 A | | 2/1994 | Keown et al. |

(Continued)

FOREIGN PATENT DOCUMENTS

JP     6094786     8/1994

OTHER PUBLICATIONS

IBM Technical Disclosure Bulletin, "Noise Reduction Method for VLSI Logic Chips", vol. 30, No. 3, Aug. 1987.

(Continued)

*Primary Examiner*—Vinh P. Nguyen
(74) *Attorney, Agent, or Firm*—Robert A. Walsh

(57) ABSTRACT

This invention teaches an apparatus and method for determining a more efficient quality assurance or reliability test screen without falsely rejecting, i.e., over stressing, short channel length devices during voltage stress test screening. Short channel lengths devices fabricated on a semiconductor wafer have a higher tendency to fail at voltage levels that would otherwise not harm long channel length devices. The failures, however, are not related to device defects. Protection to the more vulnerable devices is provided by determining the speed of the die prior to the voltage test screen, thus, segregating the devices based on operational speed performance. Next, a lower voltage is effectively applied during wafer probe test to the faster devices, which directly correspond to the population of short channel devices. A preferred measurement for device speed entails measuring the drain-to-source current of each FET, and dividing the resultant sum by the device gate channel width. The devices with the higher values represent the faster devices. Alternatively, since faster devices draw more current, the supply current specification may be adjusted based on operational speed measurements, for fast and slow devices accordingly.

4 Claims, 5 Drawing Sheets

U.S. PATENT DOCUMENTS

| | | |
|---|---|---|
| 5,519,331 A | 5/1996 | Cowart et al. |
| 5,552,739 A | 9/1996 | Keeth et al. |
| 5,604,447 A | 2/1997 | Takano |
| 5,625,288 A | 4/1997 | Snyder et al. |
| 6,259,268 B1 | 7/2001 | Crozier et al. |
| 6,574,760 B1 | 6/2003 | Mydill |

OTHER PUBLICATIONS

IBM Technical Disclosure Bulletin, "Test System for Narrowing the Range of Performance Characteristics of Monolithic Integrated Circuits", vol. 15, No. 4, Sep. 1972.

* cited by examiner

DYNAMICALLY SWITCHED VOLTAGE SCREEN

This application is a division of application Ser. No. 10/285,960, filed Nov. 1, 2002, now U.S. Pat. No. 6,822,471, which was a division of application Ser. No. 09/738,553, filed Dec. 15, 2000, now U.S. Pat. No. 6,512,392, which was a division of application Ser. No. 09/062,043, filed on Apr. 17, 1998, which is now abandoned. The entire teachings of the above applications are incorporated herein by reference.

BACKGROUND OF THE INVENTION

1. Field of the Invention

The present invention generally relates to the production techniques of integrated circuits and, more particularly, to a dynamically switched voltage screening method for quality assurance testing of integrated circuit dies on a wafer.

2. Description of Related Art

Integrated circuit (IC) chips or dies fabricated on the same wafer have a wide range of performance in critical parameter characteristics due, in a large part, to process variations. As a result, out-going quality and reliability is compromised by the inconsistent performance of IC chips from the same wafer lot. Typically, stress testing is performed on the wafer during this fabrication process to eliminate the weaker chips from entering the next phase of the production cycle. For example, one of the tests regarded as one of the most severe, is that of subjecting the devices to particularly high temperatures; typically between 85° C. and 150° C., for accelerating the infant mortality of chips in a wafer. This test, commonly referred to as "burn-in", has the objective of stimulating the failure of those devices which have developed some defects during the fabrication process and/or during handling. However, this test does not segregate parts based solely on performance characteristics. Rather, the stress is uniformly applied to all chips of a semiconductor wafer. Additionally, this test is time consuming, equipment intensive, and costly to perform.

Alternatively, the industry has administered a voltage stress test for implementing a screen with less degrading effects. A voltage screen is basically a higher than normal voltage applied during wafer test that effectively causes defects to manifest as failures in IC chips during subsequent verification or operational testing. The problem associated with applying a higher than normal voltage level across a semiconductor die is that some dies processed with short channel lengths have a higher tendency to fail when exposed to higher voltages. These short channel length devices would not otherwise be failures except for their vulnerability to high voltage exposure. The failures are not related to defects, rather, to the over stressing of the short channel lengths in the die. Thus, as applied, the voltage screen can be responsible for false failures, an undesirable quality assurance test result. Nevertheless, the industry standard has been to continuously apply a voltage stress at one voltage level to all die on a semiconductor wafer.

As discussed by Lee and Sonoda, in "TEST SYSTEM FOR NARROWING THE RANGE OF PERFORMANCE CHARACTERISTICS OF MONOLITHIC INTEGRATED CIRCUITS", IBM Technical Disclosure Bulletin, Vol. 15, No. 4, September 1972, some circuits, such as those employed with FET technology, have performance characteristics that can differ by as much as 100% due to tolerances in the threshold voltage. Because of these wide differences, there are at one end of the distribution curve chips exhibiting fast response time and high power dissipation, and at the other end of the distribution curve chips having slower circuit response time and lower power dissipation. Thus, sorting the wafer at the IC chip level during quality assurance or reliability testing would be advantageous to identifying the more vulnerable short channel length devices and exposing them to less stress, thus, eliminating false failures during voltage screening.

In the prior art, parts have been screened during wafer testing to classify individual IC chips at various speeds. In U.S. Pat. No. 5,196,787 issued to Ovens et al. on 23 Mar. 1993, entitled, "TEST CIRCUIT FOR SCREENING PARTS", a test circuit was developed on the die to measure the DC characteristics of a device, which in turn, enabled one to estimate the AC characteristics. The AC characteristic estimations were then used to screen parts into various speed classes. However, no suggestion is made to dynamically switch or adjust the stress test levels based on the operational parameters measured.

Another method for determining the operational speed of an IC chip is disclosed in U.S. Pat. No. 5,099,196 issued to Longwell et al. on 24 Mar. 1992, entitled, "ON-CHIP INTEGRATED CIRCUIT SPEED SELECTION." By forming an oscillator in an IC semiconductor chip to generate pulses representative of the speed of other components formed in the chip, the operational speed of the oscillator (typically, a ring oscillator), and therefore, that of the other components formed in the semiconductor chip, can be determined. Again, the stress test levels are not altered in response to the operation speed measurements taken.

IC chip segregation tests also include bit pattern recognition on each device under test. This method is particularly useful in memory device testing. In U.S. Pat. No. 4,335,457 issued to Early on 15 Jun. 1982, entitled, "METHOD FOR SEMICONDUCTOR MEMORY TESTING", semiconductor memory devices are tested using a special purpose computer which employs simple test patterns to determine the weakest bits of the device, and then tests only these relatively few "weak bits" along with structurally and operationally adjacent bits using highly complex test patterns to determine if the device is functioning properly. Bit pattern recognition, however, is not a stress test screen. Thus, no adjustment of stress test levels, predicated on the bit pattern results, is either taught or suggested by this prior art.

Still, other methods may be employed to distinguish the IC chips based on variations in the operational parameters. However, independent of the method chosen, some functionally operating IC chips continue to remain vulnerable to excessive stress test screening levels due to chip-to-chip process variations.

Bearing in mind the problems and deficiencies of the prior art, it is therefore an object of the present invention to provide an apparatus and method that determines the speed of IC chips on a semiconductor wafer and adjusts the stress test levels based on the speed measured for each device.

It is another object of the present invention to provide an apparatus and method for effectively protecting the short channel IC chip population with a lower voltage during voltage stress testing of a semiconductor wafer.

A further object of the invention is to increase the outgoing quality and reliability of a semiconductor die using a voltage screen without falsely rejecting the short channel die during voltage stress testing of a semiconductor wafer.

It is yet another object of the present invention to provide an apparatus and method for segregating IC chips capable of a higher voltage withstand level without compromising the resultant yield from the wafer lot.

Another object of the present invention is to increase the measure of reliability of the devices on a semiconductor wafer by assigning supply current limits as a function of device speed.

Still other objects of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for testing integrated circuit semiconductor devices comprising the steps of: providing a wafer containing a plurality of integrated semiconductor devices; measuring a desired parameter of the devices; and, applying a stress test to the devices wherein test conditions of the stress test are adjusted based on the desired parameter measurements of the devices. Measuring a desired parameter first comprises verifying functionality of at least some of the integrated semiconductor devices at a set of operating conditions. The method further comprises the steps of: verifying device functionality at nominal operating conditions after the stress test; and, classifying the devices as failed if the devices do not function properly after the stress test.

The measuring of a desired parameter comprises measuring the operational speed of the devices prior to applying the stress test.

Additionally, applying a stress test comprises applying a first voltage at a value higher than the device normal operating voltage to the devices with a first measured operational speed, and a second voltage at a value lower than the first voltage to the devices with a second measured operational speed, the first operational speed being less than the second operational speed.

The method also comprises assigning supply current specification limits and measuring the limits of the devices such that a first supply current specification limit is assigned to devices with a faster of the operational speeds and a second supply current specification limit is assigned to devices with a slower of the operational speeds, the first supply current limit being greater than the second supply current limit.

The current invention is directed to, in a second aspect, a method for testing integrated circuit semiconductor devices comprising the steps of: providing a wafer containing a plurality of integrated semiconductor devices; determining functionality of the integrated semiconductor devices at nominal operating conditions; segregating the integrated semiconductor devices on the wafer by measuring a parameter of the devices; applying a stress test to the devices wherein test conditions of the stress test are adjusted based on the segregation parameter measurements of the devices; determining functionality of the devices at nominal operating conditions after the stress test; and, classifying the devices as failed if the devices do not function properly after the stress test.

The wafer includes devices having short and long gate channel widths, and the step of segregating the integrated semiconductor devices comprises determining which of the devices on the wafer have short gate channel widths. Applying a stress test pursuant to this method comprises applying a voltage higher than the device normal operating voltage to the devices. The step of determining which of the devices have short gate channel widths further comprises measuring the operational speed of the devices prior to applying the stress test.

Applying a stress test comprises applying a first voltage at a value higher than the device normal operating voltage to the devices with a first measured operational speed, and a second voltage at a value lower than the first voltage to the devices with a second measured operational speed, the first operational speed being less than the second operational speed.

Measuring the operational speed of the devices may comprise using flush delay time measurements or a performance sort ring oscillator to determine the operational speed of the devices.

The wafer is fabricated to include n-type and p-type field effect transistors, and wherein the step of measuring the operational speed of the devices comprises the steps of:

i) measuring drain-to-source current for the n-type and p-type field effect transistors;

ii) determining a drain-to-source current sum by summing the value of the n-type drain-to-source current with the absolute value of the p-type drain-to-source current;

iii) determining a device ISUM value by dividing the drain-to-source current sum by the gate channel width of the device; and, iv) segregating the devices based on the ISUM value wherein the devices with lower ISUM values correspond to slower operational speeds and devices with higher ISUM values correspond to faster operational speeds.

Step (iv), segregating the devices based on the ISUM value, further comprises assigning devices with ISUM values less than or equal to 700 $\mu a/\mu m$ as slower operational speed devices.

The current invention provides, in a third aspect, an apparatus for testing a wafer containing a plurality of integrated semiconductor devices including n-type and p-type field effect transistors with short and long gate channel widths, and electrical parameters comprising:

a computer containing therein a set of instructions adapted to perform the following functions:

a) measure the short and long gate channel widths of the semiconductor devices;

b) segregate the semiconductor devices by the short and long gate channel width measurements;

c) apply a voltage stress to the devices wherein the voltage stress is a function of the short and long gate channel width measurements; and, d) perform a functionality test to the devices after the voltage stress such that devices not passing the functionality test are labeled failed devices.

In a fourth aspect, the current invention provides a program storage device readable by machine, tangibly embodying a program of instructions executable by the machine to perform method steps for voltage screening semiconductor devices on a wafer, the method steps comprising:

a) determining functionality of the integrated semiconductor devices at nominal operating conditions;

b) segregating the integrated semiconductor devices on the wafer by measuring a parameter of the devices;

c) applying a stress test to the devices such that test conditions of the stress test are adjusted based on the segregation parameter measurements of the devices;

d) determining functionality of the devices at nominal operating conditions after the stress test; and, e) classifying the devices as failed if the devices do not function properly after the stress test screen.

Lastly, in a fifth aspect, the current invention provides a method for testing integrated circuit semiconductor devices comprising the steps of:
  a) providing a wafer containing a plurality of integrated semiconductor devices including n-type and p-type field effect transistors with short and long gate channel widths, and operational speed parameters;
  b) determining functionality of the integrated semiconductor devices at nominal operating conditions;
  c) segregating the integrated semiconductor devices on the wafer by measuring the operational speed parameters;
  d) applying a stress test to the devices wherein test conditions of the stress test are adjusted based on the operational speed measurements of the devices, such that a first voltage at a value higher than the device normal operating voltage is applied to the devices with a first measured operational speed, and a second voltage at a value lower than the first voltage is applied to the devices with a second measured operational speed, the first operational speed being less than the second operational speed;
  e) determining functionality of the devices at nominal operating conditions after the stress test; and,
  f) classifying the devices as failed if the devices do not function properly after the stress test.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

Figure 1:
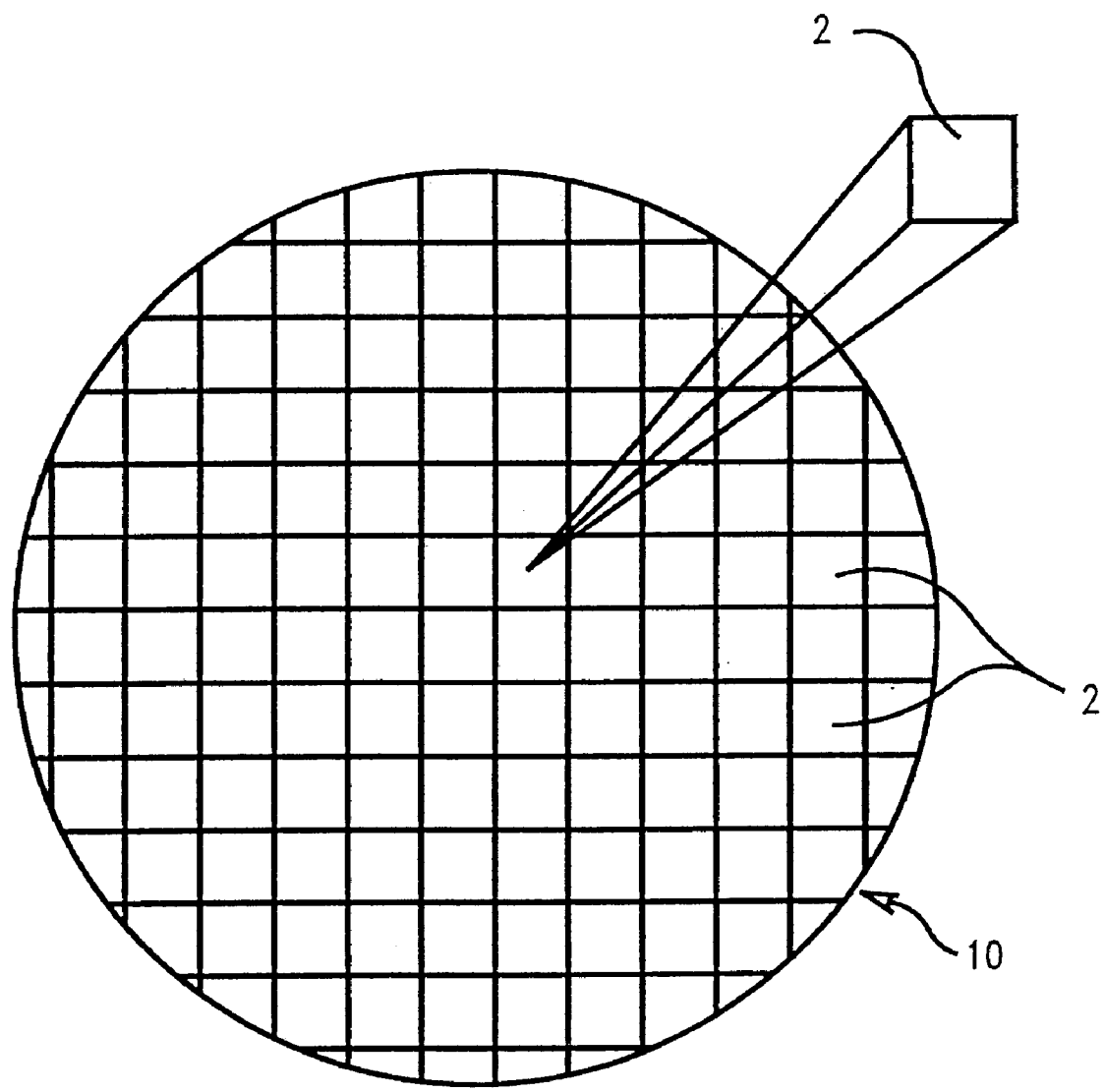
FIG. 1 is a schematic of a semiconductor wafer with an expanded view of an individual die or device on the wafer.
Figure 2:
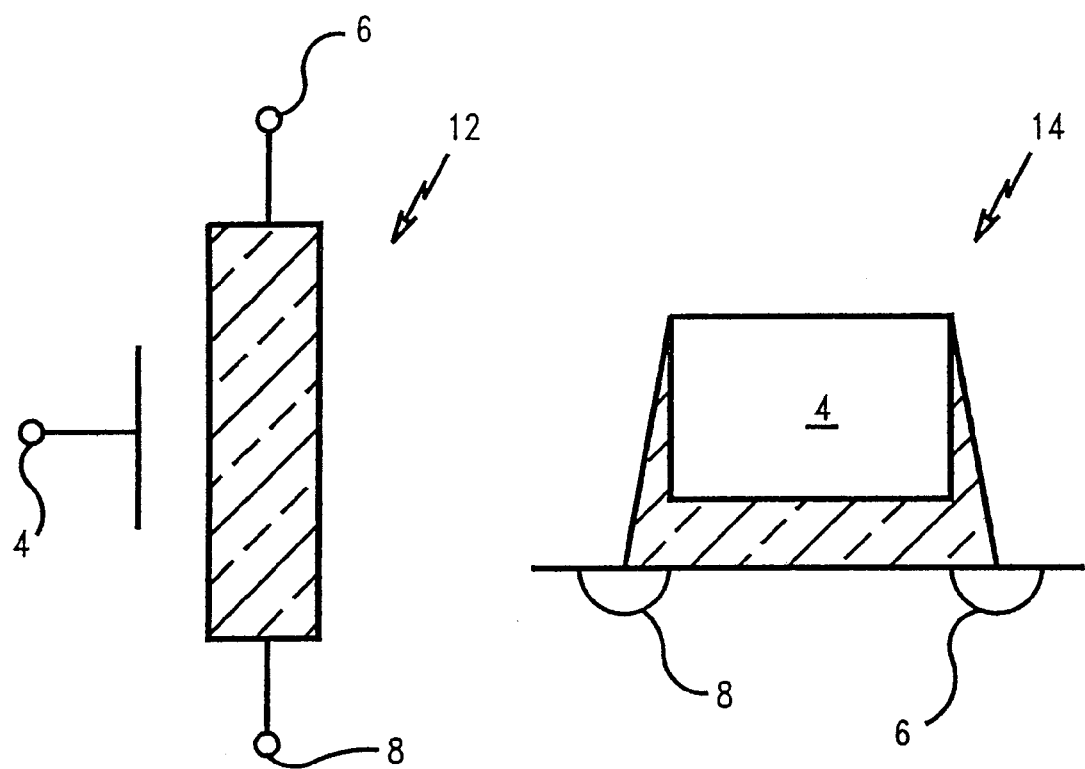
FIG. 2A is an electrical schematic of a field effect transistor.
FIG. 2B is a structural schematic of a field effect transistor.

In describing the preferred embodiment of the present invention, reference will be made herein to FIGS. 1–5 of the drawings in which like numerals refer to like features of the invention. Features of the invention are not necessarily shown to scale in the drawings.

In wafer probe testing of semiconductor devices, static voltage screen testing of the prior art used current limiting clamps to prevent damage from high current or high voltage. These methods improve reliability by testing for device defects at a fixed "safe voltage" condition for all chips of a product type. However, using a uniform voltage during stress test screening ultimately applies a higher than normal voltage across a semiconductor device that is processed with short channel lengths. In general, short channel lengths have a higher tendency to fail at voltage levels that would otherwise not harm long channel length devices. The failures, not related to device defects, are governed by the short channel lengths in the die. This invention teaches an apparatus and method for determining a more efficient quality assurance or reliability test screen without falsely rejecting, i.e., over stressing, short channel length devices during stress test screening. It provides this protection by determining the speed of the die prior to applying a voltage test screen, and effectively applying a lower voltage during wafer probe test to the faster devices, which directly correspond to the population of short channel devices. This method will enable manufacturers to enhance the yield of IC chips from a single wafer, and designate more robust IC chips, those with higher voltage withstand levels, from other IC chips fabricated on the same wafer lot.

In order to identify which dies should be packaged and which are to be discarded based on prospective operational performance parameters while still at the wafer level, a test structure with corresponding dedicated bond pads is typically incorporated in every die 2 of wafer 10 illustrated in FIG. 1. The methodology of incorporating a test structure on the die for reliability and quality assurance testing has been demonstrated in U.S. Pat. No. 5,286,656 issued to Keown et al. on 15 Feb. 1994, entitled, "INDIVIDUALIZED PRE-PACKAGE AC PERFORMANCE TESTING OF IC DIES ON A WAFER USING DC PARAMETRIC TEST PATTERNS", the disclosure of which is hereby incorporated by reference. Referring to FIG. 1, a portion of wafer 10 is enlarged to show the individual integrated circuit devices, dies, or chips 2.

Device speed is the preferred operational parameter that can be used to efficiently segregate chips more prone to voltage stress. Under voltage stress screening, the more vulnerable chips are also the more faster chips, because the faster chips are those with short gate channel lengths. There are a number of ways to determine device speed. Two well known methods include flush delay time measurements and performance sort ring oscillator testing. Generally, any propagation delay measurement may be employed for device operational speed distinctions.

A preferred method of determining chip speed uses a chip test structure with n-type and p-type field effect transistors (FETs), schematically shown in FIG. 2A with gate 4, source 8, and drain 6. A typical field effect transistor is also structurally depicted in FIG. 2B. The preferred operational speed measurement procedure involves measuring the drain-to-source current, IDS, of each FET. The measured currents are then summed; the value of the IDS current of the n-type FET added to the absolute value of the IDS current of the p-type FET. The total sum is then divided by the device gate channel width. This resultant is designated the device ISUM value. Die with lower ISUM values were shown to be the slower operating devices. These devices were also found to be able to withstand voltages above the nominal operating voltage for the given technology. Die with higher ISUM values represented the faster operational devices and sustained a significant yield loss due to non-functionality at the higher voltage test screen level used for the slower devices.

Figure 3:
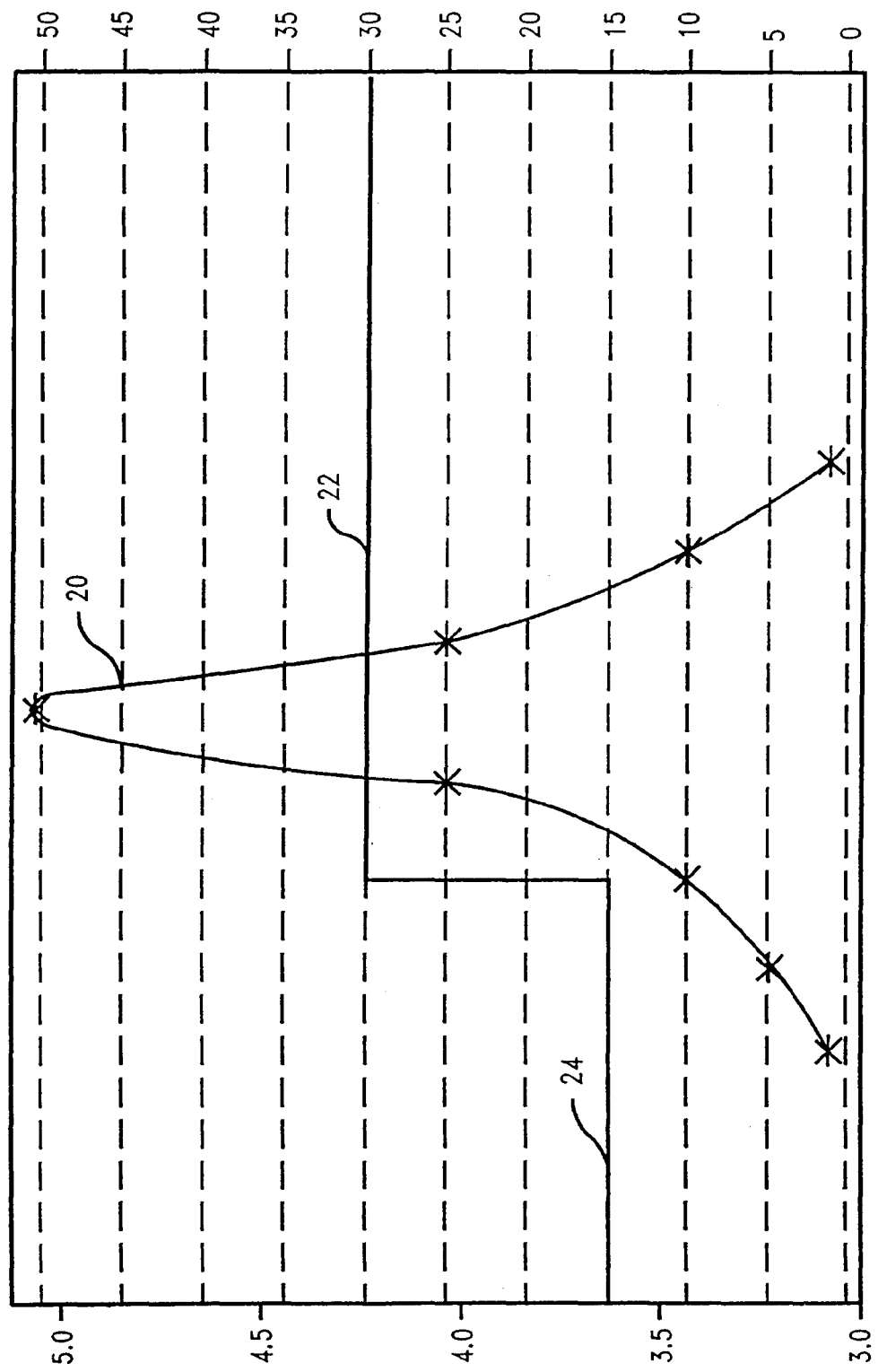
FIG. 3 is a graph of the distribution of the device gate length versus applied voltage stress levels and percent of distribution.

FIG. 3 represents a distribution 20 of devices on a semiconductor wafer as a function of gate length dimension and voltage. Region A represents the proportion of operationally slower devices, i.e., the devices with longer gate channel lengths, which typically constitute approximately 85% of the devices on the wafer. These devices can withstand voltage stress screening levels on the order of 4.25 volts, as shown by line 22. Region B represents the faster devices. These devices, being more vulnerable to the applied voltage, would yield false failures at a 4.25 volt stress test level. Consequently, a lower stress test voltage limit is proposed. Line 24 of FIG. 3 gives a recommended lower voltage level of 3.75 volts for the faster devices. Testing the faster devices at this lower voltage level will decrease the probability of inducing false failures during the voltage stress test.

The distribution of FIG. 3 may also be used to establish a line of demarcation for ISUM values of the FET devices. Those devices on the gate length distribution curve with longer gate lengths, designated by region A, generally have measured ISUM values less than or equal to 700 $\mu a/\mu m$ which correspond to slower speeds, while those devices with shorter gate lengths, designated by region B, generally have measured ISUM values greater than 700 $\mu a/\mu m$, which correspond to slower speeds, while those devices with shorter gate lengths, designated by region B, generally have measured ISUM values greater than 700 $\mu a/\mu m$, corresponding to faster speeds. The slower devices can withstand a greater voltage stress without inducing false failures. Preferably, the exact voltage level is determined by varying the voltage across a defined range such that the measured device yield drop is about 10% when the devices are subjected to the higher voltage levels. Thus, the distribution curve 20 plays a significant role in selecting the stress test limits. Importantly, this 700 $\mu a/\mu m$ limit is governed by the technology of the device, and as such, represents an example of an ISUM limit for a given technology, rather than an absolute value for all technology applications.

Once device speeds have been determined at the wafer final test, dynamic voltage stress test levels are set accordingly. For example, the Cyrix 686 integrated circuit can be successfully dynamically tested at 4.2 volts for chips with speeds that exceed 6.5 ns, while 3.6 volts is used for chips with speeds less than or equal to 6.5 ns.

Figure 4:
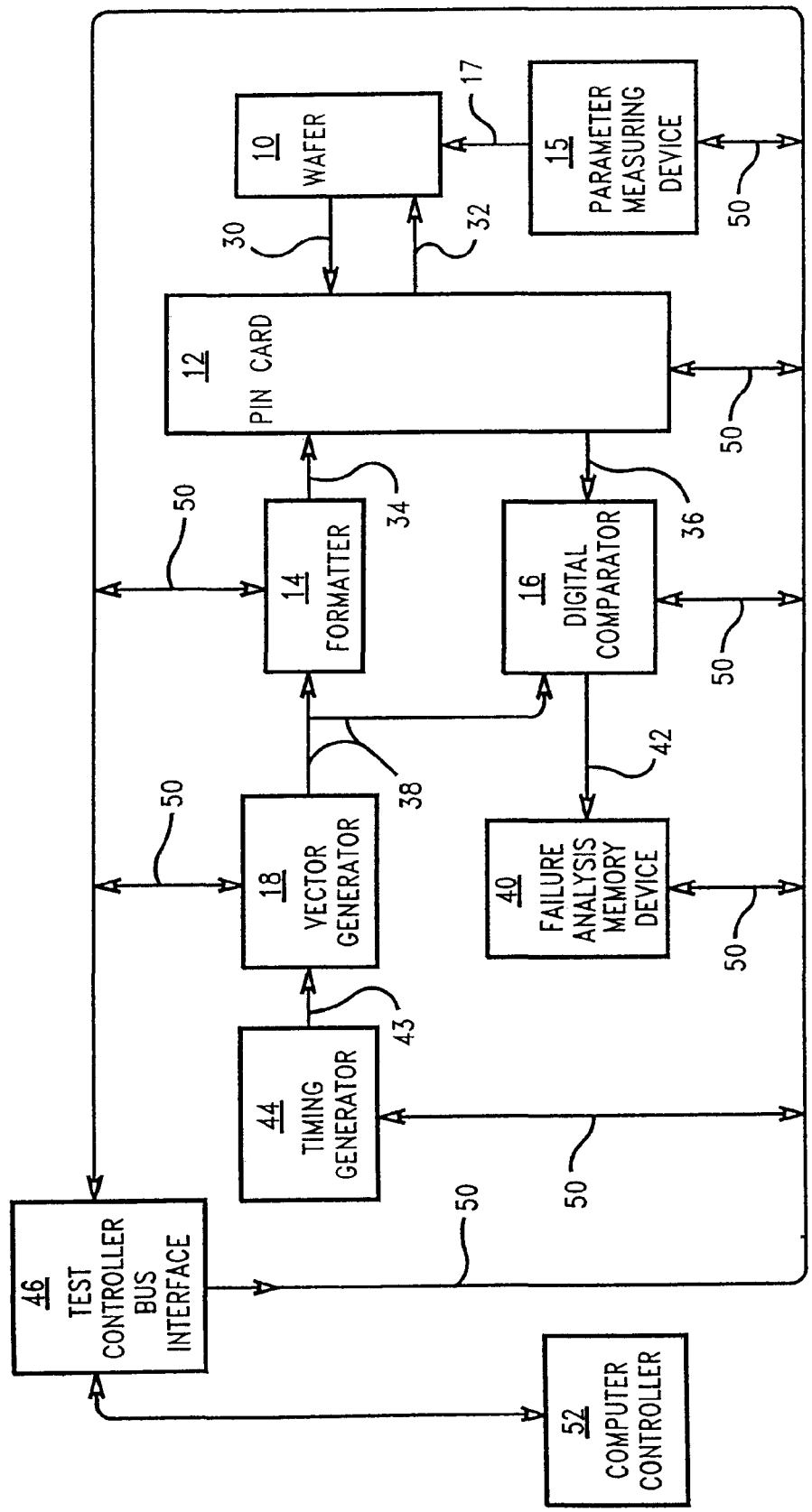
FIG. 4 is an architectural schematic of the apparatus of the present invention.

Referring to FIG. 4, the architecture of the apparatus used to implement the current invention consists of an automated test equipment (ATE) system, which includes in part, a computer controller 52 and memory devices 40. Two ATE systems that can be used to perform this test include the ADVENTEST system and the TERYDYNE test system.

In general, the architecture of such an automated test equipment system typically includes: a wafer under test 10; a pin card 12 interfacing the wafer under test through electrical conductor lines 30 and 32; a parameter measurement device 15 with input test vector bus line 17 to the wafer 10; a formatter 14 and digital comparator 16 that connect to pin card 12 through test vector bus lines 34 and 36, respectively; a vector generator 18 with test vector bus lines 38 that input to the formatter 14 and digital comparator 16; a failure analysis memory device 40 receiving input from the digital comparator over test vector bus line 42; a timing generator 44 with input lines 43 to the vector generator 18; a test controller bus interface 46 with test controller I/O bus lines 50; and a computer controller 52.

As this general architecture indicates, the current invention is not dedicated to any particular ATE. Any ATE with the capability of running the modified software and providing the functions necessary to test and record designated electrical parameters of each die may successfully perform the method of the current invention.

The preferred method of the current invention comprises 1) verifying the functionality of integrated semiconductor devices at nominal operating conditions; 2) segregating the integrated semiconductor devices on the wafer by measuring the operational speed of the devices; 3) applying a two level voltage stress test to the wafer such that the higher voltage is applied to the slower devices, and the lower voltage is applied to the faster devices; 4) verifying the device functionality at nominal operating conditions after the stress test; and, 5) classifying the devices as failed if they do not function properly after the stress test screen.

Figure 5:
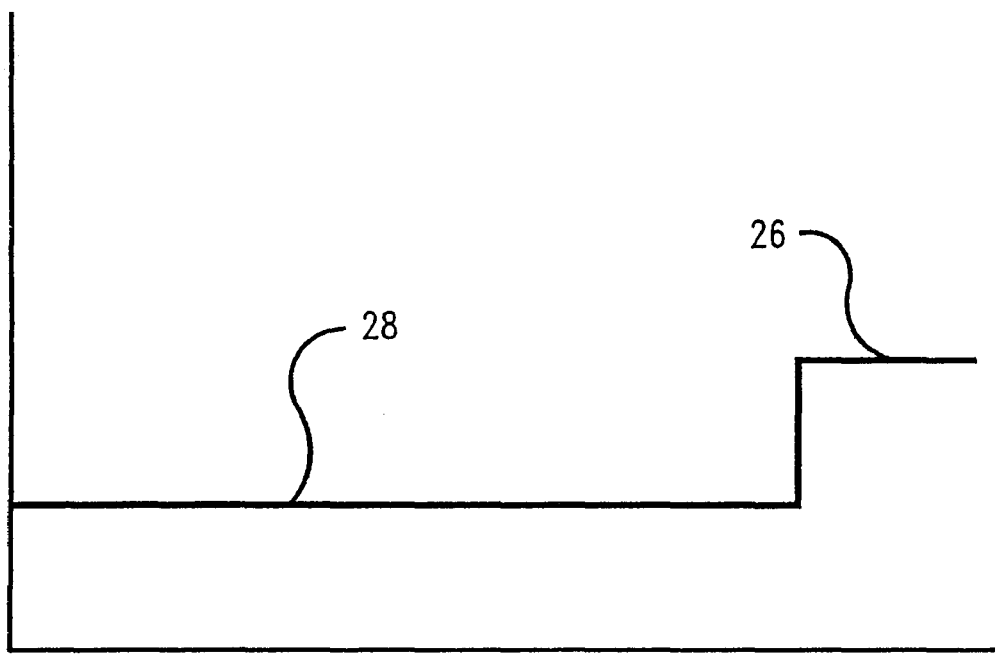
FIG. 5 is graph of supply current specification as a function of slow and fast devices on a semiconductor wafer.

Alternatively, data from the operational speed measurements discussed above may be used to enhance the device yield, i.e., eliminate false failures, by helping to establish a supply current specification that is a function of device speed. Total chip current, $I_{CC}$, is another reliability screen parameter commonly tested in the industry. The basic theory is that defects draw more current, and the $I_{CC}$ test screens these die before they are packaged. However, short channel dies, or faster devices, naturally draw more current and can be falsely rejected. This alternate embodiment allows the applied $I_{CC}$ specification to change as a result of the operational speed measurements. Referring to FIG. 5, the devices with faster speeds (shorter channels) are allowed to draw more supply current, as depicted by line 26, without being designated as failed, while the devices with slower speeds are assigned a lower supply current limit, as depicted by line 28.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention

What is claimed is:

1. A method for testing electronic devices comprising the steps of:
    a) providing a plurality of electronic devices;
    b) determining functionality of said devices at nominal operating conditions;
    c) segregating said devices by measuring a parameter of said devices;
    d) applying a stress test to said devices wherein test conditions of said stress test are adjusted based on said segregation parameter measurements of said devices;
    e) determining functionality of said devices at nominal operating conditions after said stress test; and,
    f) classifying said devices as failed if said devices do not function properly after said stress test.

2. The method of claim 1 wherein said device parameter measurements are based on short and long gate channel widths, and wherein said step (c), segregating said devices, comprises determining which of said devices have short gate channel widths.

3. The method of claim 2 wherein the step of determining which of said devices have short gate channel widths further comprises measuring the operational speed of said devices prior to applying said stress test.

4. The method of claim 3 wherein said device includes n-type and p-type field effect transistors, and wherein the step of measuring the operational speed of said devices comprises the steps of:
    i) measuring drain-to-source current for said n-type and p-type field effect transistors;
    ii) determining a drain-to-source current sum by summing the value of said n-type drain-to-source current with the absolute value of said p-type drain-to-source current;

iii) determining a device ISUM value by dividing said drain-to-source current sum by said gate channel width of said device; and, iv) segregating said devices based on said ISUM value wherein said devices with lower ISUM values correspond to slower operational speeds and devices with higher ISUM values correspond to faster operational speeds.

* * * * *